United States Patent [19]

Kaplow et al.

[11] E Re. 30,383

[45] Reissued Aug. 26, 1980

[54] HIGH-INTENSITY, SOLID-STATE-SOLAR CELL DEVICE

[75] Inventors: Roy Kaplow, Newton; Robert I. Frank, Lexington, both of Mass.

[73] Assignee: Massachusetts Institute of Technology, Cambridge, Mass.

[21] Appl. No.: 26,754

[22] Filed: Apr. 3, 1979

Related U.S. Patent Documents

Reissue of:

[64] Patent No.: 4,110,122
Issued: Aug. 29, 1978
Appl. No.: 689,989
Filed: May 26, 1976

[51] Int. Cl.[2] ..... H01L 31/06

[52] U.S. Cl. ..... 136/89 MS; 136/89 SJ; 357/30; 357/20

[58] Field of Search ..... 136/89 MS, 89 P, 89 PC, 136/89 CC, 89 SJ; 357/20, 30, 49

[56] References Cited

U.S. PATENT DOCUMENTS

| | | | |
|---|---|---|---|
| 2,428,537 | 10/1947 | Veszi et al. | 136/89 |
| 3,104,188 | 9/1963 | Moncrieff-Yeates | 136/89 |
| 3,422,527 | 1/1969 | Gault | 29/572 |
| 3,546,542 | 12/1970 | Riel et al. | 357/30 |
| 3,653,971 | 4/1972 | Lidorenko et al. | 136/89 |
| 3,948,682 | 4/1976 | Bordina et al. | 136/89 |
| 3,971,672 | 7/1976 | Lampkin | 136/89 |
| 3,994,012 | 11/1976 | Warner, Jr. | 357/30 |
| 4,021,323 | 5/1977 | Kilby et al. | 204/129 |

*Primary Examiner*—Aaron Weisstuch
*Attorney, Agent, or Firm*—Hopgood, Calimafde, Kalil, Blaustein & Lieberman

[57] ABSTRACT

A semiconductor solar cell capable of converting incident radiation to electrical energy at high efficiency includes a plurality of series-connected unit solar cells formed on a common wafer of semiconductor material. The unit solar cells each include a semiconductor substrate of one conductivity type and a p-n junction formed in the substrate. The light-receiving surface of the cell may have an opaque member thereon, and incident light is directed onto the portion of that surface not covered by the opaque member. A variety of embodiments illustrates the invention.

27 Claims, 11 Drawing Figures

HIGH-INTENSITY, SOLID-STATE-SOLAR CELL DEVICE

Matter enclosed in heavy brackets [ ] appears in the original patent but forms no part of this reissue specification; matter printed in italics indicates the additions made by reissue.

The present invention relates generally to semiconductor devices, and more particularly to semiconductor solar or photovoltaic cells.

As the cost of fossil fuels continues to increase, and as the remaining supply of such fuels decreases, an increasing amount of activity is being directed toward achieving ways of obtaining energy from solar radiation. As a significant part of this activity, a considerable amount of investigation and research has been performed in attempts to develop semiconductor solar cells that efficiently convert incident radiation, such as sunlight, into electrical energy.

The use of solar cells in practical applications has thus far been limited, primarily as a result of their high cost, and to a lesser extent, because of their relatively low efficiency, and by the relatively low density of the sun's radiation at the earth's surface (in the area of 1000 $w/m^2$), which limits the amount of electrical energy which the known cells are able to generate per unit area of cell. Accordingly, it has generally been believed necessary to interconnect into an array a large number of the known solar cells in order to produce a desirably large electrical output. The need for large quantities of solar cells in a typical installation has caused the costs of such installations to be prohibitively high for widespread application.

In conventional solar cells, the p—n junction is formed parallel to the upper surface of the cell which receives the incident radiation, and a contact grid is formed on that upper surface. In these cells, current flows in the plane of a thin surface region from the contact grid to the base of the cell. In order to avoid series resistance effects, either a very fine grid geometry or a highly doped surface region or both must be provided in the cell. The conventional cell, even when modified for improved performance at high concentrations of incident light, becomes progressively less efficient at concentrations of over about 50 suns, so that it is not practical to continue to increase the output per unit area of cell by increasing the concentration ratio much beyond about a factor of 50.

Another problem that has been found with the conventional solar cells is that the series connection of these cells may be achieved only by making external connections between individual cells. That is, the conventional cells do not permit the formation of isolated individual solar cells which can be integrally connected to form a single group of a number of groups of series-connected cells on a single wafer of semiconductor material.

One solution that has been proposed to reduce the cost of a solar cell array is to effect greater concentration of collected solar energy upon a reduced area of the solar cells. However, as noted above, the efficiency of conventional cells decreases for incident light substantially beyond concentrations in the order of 50 suns.

The present invention provides a solar cell, as described with respect to several embodiments, in which the exposed surface of the cell is characterized by "active" light-receiving areas separated by conductive members which may be opaque. These cells may be used to advantage with a lens structure that directs or focuses substantially all incident light to fall on at least a portion of the exposed surface of the light-receiving areas of the cell, and the cells are configured for efficient operation over a wide range of radiation intensities, extending well beyond 50 suns; such concentrations may be provided by a collection system as disclosed in our copending application, Ser. No. 690,093, (now U.S. Pat. No. 4,086,485) filed on even date herewith.

A solar cell for use with high-intensity radiation having a vertical p—n junction has been disclosed in a NASA Technical Memorandum entitled "The High Intensity Solar Cell—Key to Low Cost Photovoltaic Power" by Bernard L. Sater and Chandra Goradia, and presented at the Eleventh Photovoltaic Specialists Conference sponsored by the IEEE in May, 1975. Other solar cells having vertical p—n junctions are described in U.S. Pat. No. 3,690,953 to Wise, and in an article entitled "Analysis of Vertical Multijunction Solar Cells Using a Distributed Circuit Model" by Pradeep Shah that appeared in Solid-State Electronics, 1975 Vol. 18, pp. 1099–1106.

Despite the work that has been done in an attempt to develop solar cells for use with high-intensity light, some of which include the use of vertical p—n junctions, the art has thus far failed to develop a practical solar cell of this type which is efficient in use and practical and reliable both in fabrication and in use. For example, the solar cell described in the aforementioned NASA publication is formed from a series of diffused wafers, which are stacked and sliced to form the plurality of vertical p—n junctions. Among other defects associated with this cell is the inability to employ high-temperature surface treatments, such as surface oxide passivation techniques; and the difficulty in obtaining accurate spacing between junctions can be an additional problem in certain applications. Moreover, the known solar cells do not take optimum advantage of the increase in efficiency that can be realized by minimizing the effect of inactive (including opaque) areas of the cell by directing the incident light onto the active (or non-opaque) areas of the cells.

It is, therefore, an object of the invention to provide an improved solar cell that operates efficiently and reliably over a wide range of illumination intensities, including very high intensities.

It is a further object of the invention to provide a solar cell having particular utility when used in conjunction with a means for focusing light onto selected areas of the cell surface.

It is another object of the invention to provide a solar cell generally of the type disclosed which may be fabricated economically.

It is yet a further and general object of the invention to provide a solar cell which, when exposed to relatively high concentrations of incident light, will produce relatively large amounts of electrical energy.

To the accomplishment of the above and to further objects that may hereinafter appear, the present invention relates to an improved solar cell as deined in the appended claims, and as described in the following specification as considered with the accompanying drawings, in which:

The several embodiments of the invention described hereinbelow are all shown as having an n-type silicon substrate. It is to be understood, however, that the solar cell of the invention may also be implemented with a substrate of p-type polarity, in which case the polarity of the other regions in the cell would be reversed, with n replaced by p, n+ replaced by +, and so on. It will also be understood that other types of semiconductor material may also be employed, and that a heterojunction, as well as the homojunction structure described, may be employed.

Figure 1:
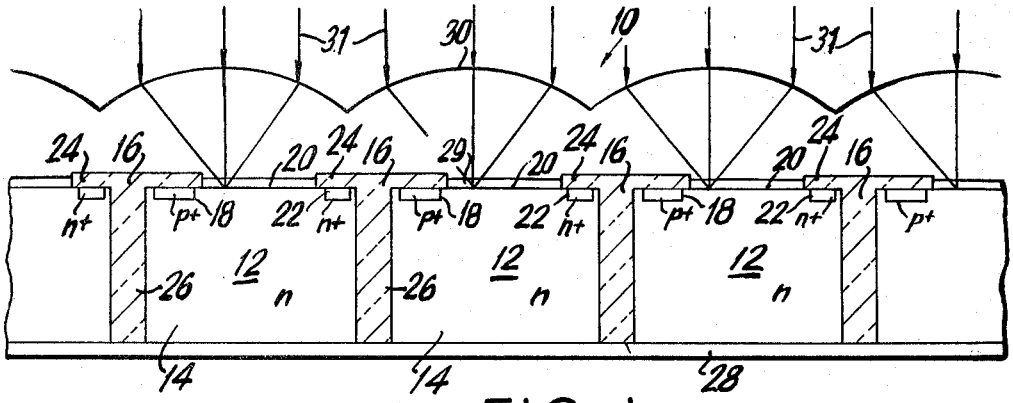
FIG. 1 is a schematic diagram, as viewed in cross-section, of a solar cell according to a first embodiment of the invention.

Turning to the embodiments of the invention described in the drawings, FIG. 1 illustrates a solar cell arrangement generally designated 10, which is divided into a plurality of individual or unit solar cells 12, each of which includes an n-type semiconductor substrate 14. The unit solar cells 12 are separated from one another by spaced, parallel stripes 16 of conductive material, which may be advantageously formed of aluminum; stripes 16 are thus opaque, but electrical conductivity rather than opacity is the primary function of stripes 16, as will become clear, A p+-type region 18 is formed in the upper, light-receiving surface 20 of each unit solar cell, near one end of the cell, and forms a p−n junction with the n-type substrate. Also formed in the upper substrate surface at the other end of the cell is an n+ region 22.

Figure 1A:
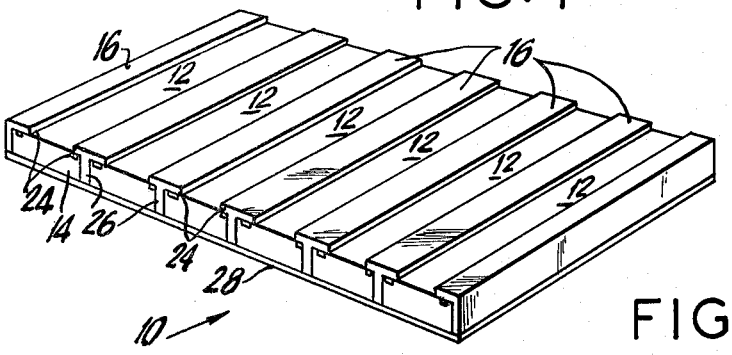
FIG. 1a is a perspective view of a portion of a solar cell as described in FIG. 1.

The stripes 16 extend along the length of each of the unit cells 12; as shown in FIG. 1, each stripe includes at its upper end a conductive upper transverse or flange section 24 which extends over and covers a portion of the upper light-receiving surface 20 of the adjacent unit solar cell 12, thus defining the active area, i.e., the area of the substrate surface that is available for receiving radiation. The same flange sections 24 serve additionally as electrical or ohmic contacts, in that opposed adjacent flanges of adjacent sections 24 overlie and contact the p+ and n+ regions 18, 22 of each of the unit solar cells. A vertical portion 26 extends from the aluminum upper flange section and fills the space between adjacent unit solar cells 12; such space will be understood to have been formed as by anisotropic etching, in which case each vertical portion 26 may be a filler in the etched groove. Vertical portions 26 may be of aluminum, or of a semiconductor material, such as polycrystalline silicon, or an insulator such as glass or epoxy; in all cases, however, the flange sections 24 are electrically conductive, for the purposes already indicated. To complete a description of the solar cell, a thin layer of silicon oxide 28 is formed, as by a thermal-oxidation process on the underside of the cell, and an oxide or anti-reflective coating 29 is formed on the exposed, light-receiving or active surface of the substrate. A typical arrangement of the solar cells, as viewed in perspective is shown in FIG. 1a.

Since the use of overlying opaque flange sections 24 has the effect of reducing the active areas available for light energy conversion, the solar cell of the invention is preferably used in conjunction with a light focusing means, such as the lens structure shown schematically at 30. This lens structure focuses the incident sunlight, indicated at 31, on the exposed portion of the substrate surface, that is, the portion thereof not covered by the opaque stripe, and preferably focuses the incident light into a reduced-width band which is incident on the substrate surface at an accurately predetermined distance from the p−n junction of each of the unit cells 12; preferably, the band of focused (concentrated) light is in proximity to the p−n junction region adjacent to that flange section 24 which overlies the region 18, as shown in FIG. 1.

In the solar cell of FIG. 1, the p−n junctions of the individual solar cells 12 are effectively electrically connected in series by means of the conductive arrangement between the overlying conducting flange sections 24 and the location of the p+ and n+ regions.

That is, in the operation of the solar cell of FIG. 1, light incident on surface 20 causes carriers to flow in the substrate across the p−n junction of each unit solar cell. The resulting current flow is across the upper portion of the n-type substrate and to the n+ region 22, and then to the flange section 24 which conducts the current to the p+-region of the adjacent unit solar cell. The conduction of current proceeds in series across the individual solar cells to a current collector (not shown). Assuming identical illumination on each unit cell, the total voltage of an array of series-connected unit cells is equal to the sum of the voltages across all unit cells. The total short-circuit current is equal to the short-circuit current produced by an individual unit cell.

Figure 2:
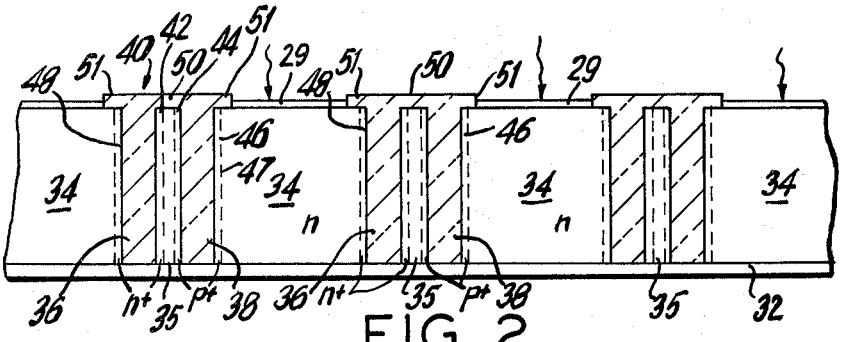
FIG. 2 is a schematic diagram as viewed in cross-section, of a solar cell according to a modification of the embodiment of FIG. 1.

In the embodiment of the invention illustrated in FIG. 2, the unit solar cells 34 are separated by an intermediate portion of semiconductor material 35 which is provided between adjacent vertical portions 36 and 38 of a $\pi$-shaped member 40 which separates the single n-type silicon wafer into a plurality of individual solar cells. The intermediate sections 35 are each of n-type conductivity and include an n+ region 42 along one side and in contact with one vertical conductive portion 36, and a p+ region 44 along another side and in contact with the other conductive portion 38.

The vertical portions 36, 38 separating the individual solar cells are interconnected by a bridge section 50 made preferably of aluminum, which as in the embodiment of FIG. 1, has transverse or flange sections 51 that extend transversely over the upper surfaces of each of the adjacent solar cells. The vertical portions 36, 38 may be either of the same conductive material as the bridge section, or can be of an insulator, such as glass or epoxy, a semiconductor such as polycrystalline silicon, or a metal other than aluminum. Opposing flange sections 51 of each of the conductive channels respectively overlie and establish electrical contact with the p+ region 46 and n+ region 48 of each solar cell. As in the embodiment of FIG. 1, the lower surface of the solar cell that is opposed to the light-receiving upper surface is coated with an oxide layer 32. Although radiation is shown in FIG. 2 as being directly incident on the surface of the solar cells, a lens arrangement such as that shown in FIG. 1, may be advantageously employed with the solar cell structure of FIG. 2.

In operation of the embodiment of FIG. 2, the current flow induced in the solar cells by the incident radiation flows from the vertical p−n junction 47 across the uppper portion of the substrate to the n+ region 48 and then to the conductive flange section 51, over the bridge section 50, to the next conductive flange section 51, and then to the p+ region 46 of the adjacent solar cell.

Figure 3:
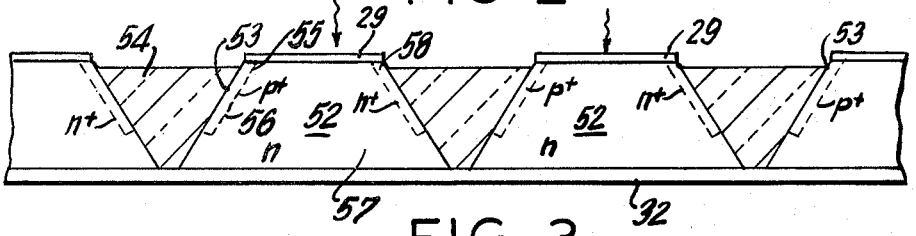
FIG. 3 is a schematic diagram, as viewed in cross-section, of a solar cell according to a second embodiment of the invention.

In the embodiment of the invention illustrated in FIG. 3, the solar cells 52 ar trapezoidal as viewed in cross-section and are separated by wedge-shaped (as viewed in cross-section) cutouts 53, formed as by anisotropic etching. These cutouts may, as shown, be filled with a conductive material 54, such as aluminum, A + region 55 forming a slanted p−n junction 56 with the n-type substrate 57 is formed along part of one wall of the solar cell in electrical contact with the aluminum conductive material. An n+ region 58 is formed in part of the opposing wall of the solar cell and is in electrical contact with the aluminum conductive material in the adjacent cutout. The bottom surface of the solar cell opposed to the radiation-receiving surface may be, as before, an oxide film, designated 32.

In the operation of the solar cell of FIG. 3, current flows across the p−n junction to the n+ region and through the aluminum conductive material, and from there to the next adjacent solar cell. Since the area of the upper radiation-receiving upper surface is relatively small, as compared to the bottom surface, a light-focusing system, such as that shown in FIG. 1, may be used to advantage in the embodiment of FIG. 3.

Figure 4:
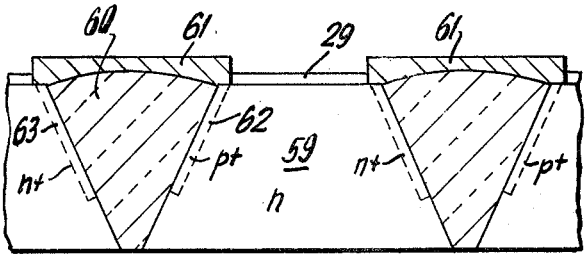
FIG. 4 is a schematic diagram, as viewed in cross-section, of a solar cell according to a third embodiment of the invention.

The solar cell illustrated in FIG. 4 is similar to that of FIG. 3, in that the unit cells 59 are trapezoidal in cross-section and are separated from one another by wedge-shaped grooves. In the embodiment of FIG. 4, those grooves are filled with an insulation material 60, such as glass or epoxy. Each section of insulation material 60 is covered with a metal layer 61 which extends over material 60 and electrically contacts the p+ regions 62 and n+ regions 63 of adjacent solar cells to achieve series-connection between adjacent cells.

The walls of the grooves in the solar cell of FIG. 4 may also be oxidized to form a silicon oxide coating on the walls, and thereafter the groove may be filled with a metal or a semiconductor material. The oxidized grooves may also be filled with polycrystalline silicon, which has the advantage of having a coefficient of thermal expansion that is close to that of the silicon substrate.

Figure 5:
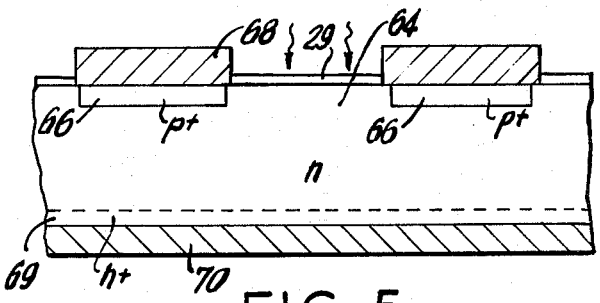
FIG. 5 is a schematic diagram, as viewed in cross-section, of a solar cell according to a fourth embodiment of the invention.

The embodiment of the invention in FIG. 5 also contemplates use with a light focusing system as it too provides a relatively large opaque contact area, with accompanying reduction of the active area to the upper radiation-receiving surface of the cell. Thus, as shown, the solar cell includes an n substrate 63 in which p+ regions 66 are formed on the upper surface. The p−n junction formed by p+ regions 66 and the n substrate is primarily horizontal, being parallel to the substrate surface. Each of the p+ regions 66 is covered by an opaque conductive electrode 68 and the opposed surface of the solar cell is covered with an n+ region 69 and an ohmic contact 70. Unlike the series connection of the individual unit solar cells of FIGS. 1–4, the solar cell of FIG. 5 is but a single cell wherein plural electrically parallel paths of current flow are established from the individual p+ regions and through the substrate to the ohmic contact 70 at the base of the cell.

In the following embodiments, the individual unit solar cells are formed and connected generally as described for FIGS. 1–4, i.e., formed on a single wafer of semiconductor material and connected in series, or in series-connected subunits which are later connected in parallel; and increased efficiency of current collection is achieved by providing two p−n junctions in each unit cell so that a photogenerated carrier can travel to a p−n junction from a distance which is no more than one-half the width of each individual unit solar cell as compared to a distance which may be the entire width of the cell in the embodiments of FIGS. 1–4.

Figure 6:
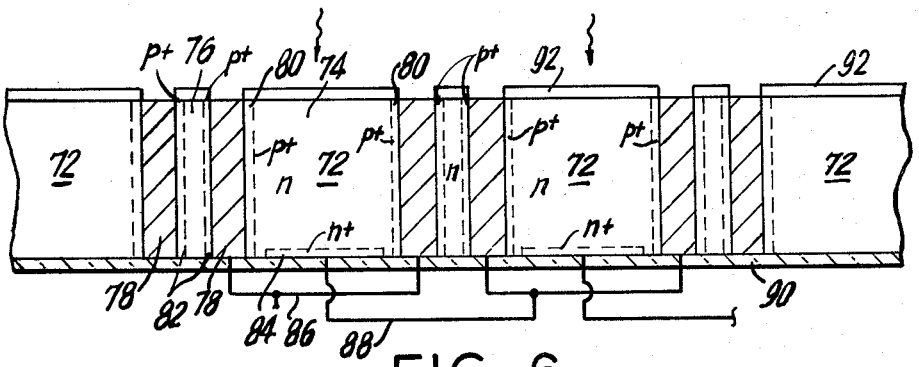
FIG. 6 is a schematic diagram as viewed in cross-section of a solar cell according to a fifth embodiment of the invention.

More particularly, the solar cell illustrated in FIG. 6 includes a series of individual unit solar cells 72, each of which comprises an n-type substrate 74. The solar cells, as in the embodiment of FIG. 2, are separated by an n-type intermediate semiconductor region 76 on each side of which is a vertical conductive section 78. P+ regions 80 are formed along each end wall of the substrate 74 and are in contact with the adjacent conductive vertical sections 78. Similarly, each intermediate region 76 includes p+ regions 82 formed along its end wall and in contact with the adjacent vertical conductive section 78.

An n+ region 84 is formed at the opposing surface of the substrate and is spaced inwardly from the end p+ regions 80. To connect the individual solar cells in series, a first connection is made, as shown schematically at 86, between the vertical regions at the ends of each solar cell, and a second electrical connection is made, as shown at 88, between the n+ region 84 of one solar cell and the vertical conductive sections 78 of the adjacent cell. An oxide layer 90 is formed on the under surface of the solar cell, and a passivation and anti-reflective coating 92 may, as shown, be formed on the upper surface of the solar cell. The flow of carriers (electrons) is across the p−n junctions formed by the p+ regions and substrate to the n+ region and from the latter to the p+ regions of the succeeding solar cell, via connection 88.

Figure 7:
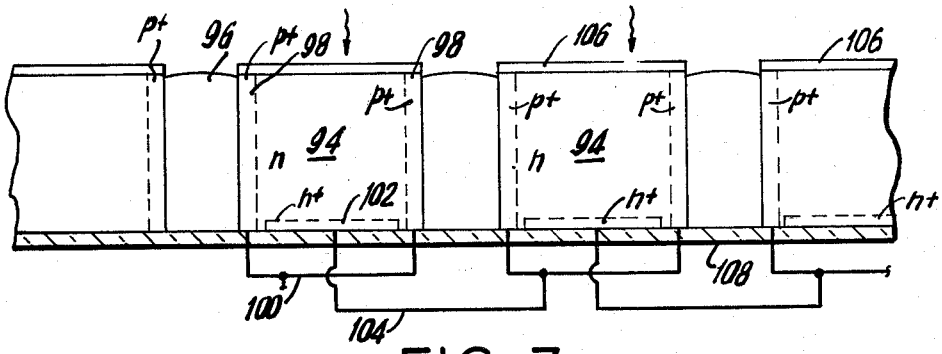
FIG. 7 is a schematic diagram, as viewed in cross-section, of a solar cell according to a variation of the embodiment of FIG. 5.

The embodiment of the invention illustrated in FIG. 7 is a modification of that illustrated in FIG. 6, but differs therefrom in that adjacent solar cells 94 are separated from one another by grooves filled with insulating material 96 which may be epoxy, glass, or other suitable insulating material. The walls of the grooves could, alternatively, be thermally oxidized after which the grooves may be filled with polycrystalline silicon or a metal such as aluminum. An advantage of the use of polycrystalline silicon to fill the grooves is that is permits the entire surface of the cell, including the surface of the material in the grooves, to be thermally oxidized.

The connection between adjacent cells is made by connecting the p+ regions 98 to one another by a first connection, schematically indicated at 100. The n+ region 102 of one cell is series connected to the p+ region 98 of the next solar cell by means of a second connection indicated at 104. As in the embodiment of FIG. 6, the upper and lower surfaces of the cell are covered with a passivation and antireflecting coating 106 and an oxide coating 108, respectively. In the embodiment of FIG. 7, since current must flow in the p+ regions 98, those regions should be of sufficient depth to carry the current and may be made deeper than the p+ regions 80 in the embodiment of FIG. 6 in order for those regions to be able to carry the current without introducing excessive series resistance.

Figure 8:
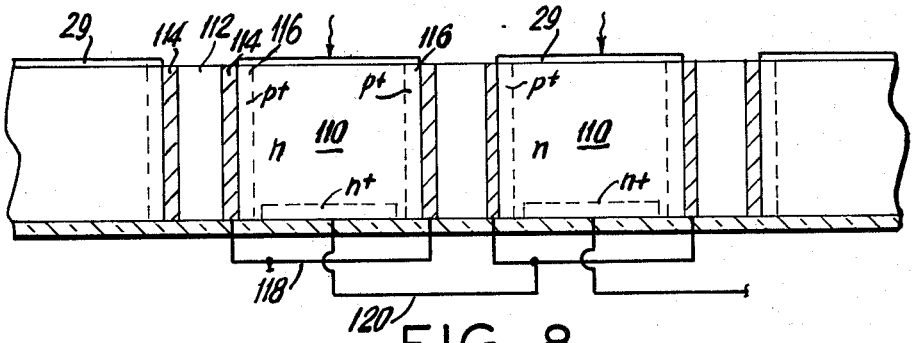
FIG. 8 is a schematic diagram, as viewed in cross-section, of a solar cell according to a further modification of the embodiment of FIG. 5.

The embodiment of FIG. 8 is a further modification of the embodiments of FIGS. 6 and 7, in that the individual solar cells 110 are separated by a region of insulating material 112 having a conductive layer 114 along each side wall, the conductive layers 114 being in contact with p+ regions 116 formed in the adjacent solar cells. Electrical series connection is effected between the solar cells by connecting the conductive layers 114 adjacent to the end walls of each solar cell, as indicated by a first connection 118, and by a second connection from thethe n+ region of the cell to the connection 118 between the conductive layers 116 which are in contact with the next-adjacent solar cell. Since the conduction in this embodiment is in the metal layers 114, the resistance of the p+ regions is less significant.

Figure 9:
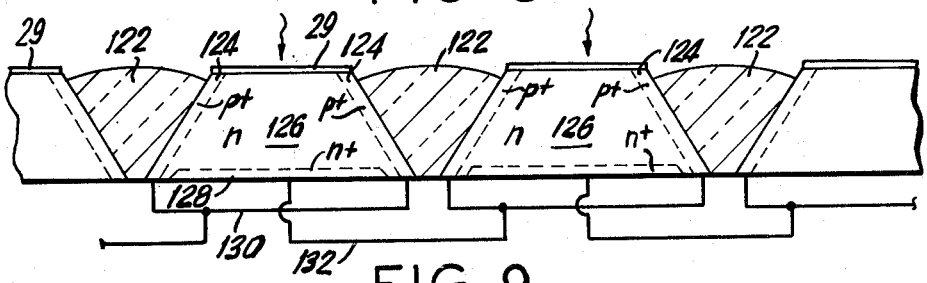
FIG. 9 is a schematic diagram, as viewed in cross-section, of a solar cell according to a modification of the embodiment of FIG. 3.

The embodiment of FIG. 9 is a modification of the embodiment of FIG. 3 incorporating the concept of two p−n junctions per unit cell, as in the embodiments of FIGS. 6–8. That is, the solar cells in FIG. 9 are separated by wedge-shaped cutouts, which are filled with an insulating material 122, which may be in the form of an epoxy or glass; alternatively, the walls of the groove may be oxidized, and the grooves thereafter filled with polycrystalline silicon or metal. P+ regions 124 are formed along each wall of the solar cells 126, and an n+ region 128 is formed on the lower surface of each solar cell. The cells are series-connected by means of a first electrical connection, schematically indicated at 130, formed between the p+ regions 124 of each cell, and by a second connection, indicated at 132, between the n+ region 128 of one cell and the p+ regions of the next cell.

Figure 10:
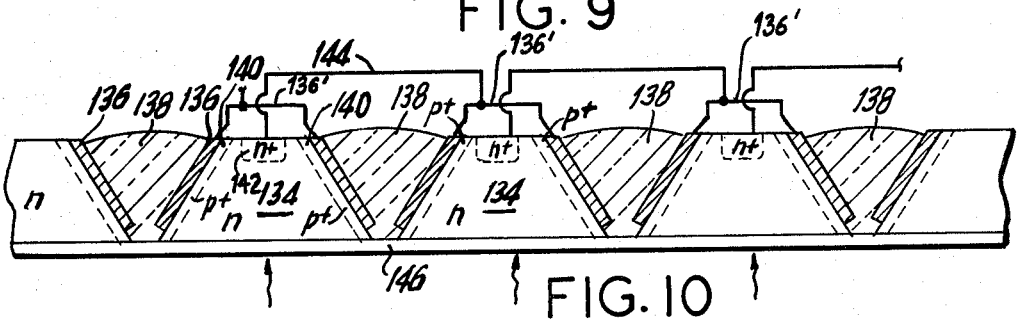
FIG. 10 is a schematic diagram, as viewed in cross-section, of a solar cell according to a further modification of the embodiment of FIG. 3.

The embodiment of FIG. 10 represents a modification of the embodiment of FIG. 9 in several respects. First, the light is incident on the wider (lower in FIG. 10) surface of each of the solar cells 134. Conductive, e.g. aluminum, layers 136 are formed on the sloping walls of the solar cells and the remainder of the cutout is filled with an insulating material 138, such as epoxy or glass; also, as with FIG. 9, the groove walls may be oxidized and the grooves filled with polycrystalline silicon or metal. P+ regions 140 are formed in the solar cells along the sloping walls and are in contact with the conductive layer 136. An n+ region 142 is formed in the narrow (upper in FIG. 9) surface of the solar cell. Series connection between adjacent solar cells is effected by means of a first connection indicated at 136', connecting the p+ regions of a given cell, and by a second connection, indicated at 144, connecting the n+ region of one cell with the connection 136' between spaced p+ regions of the next-adjacent solar cell. The wide (lower) surface of the cell which receives radiation is preferably covered with a passivation and antireflecting coating 146. If desired, the metal layers in the embodiment of FIG. 10 could be omitted and the p+ regions be made sufficiently thick to carry current with a low resistance.

If desired, the n+ region or layer formed on the lower surface in the embodiment of FIGS. 6–10 may be divided into a number of spaced, reduced-width, n+ regions formed in each unit cell, with electrical contact being made to only one such n+ region. A similar n+ region could be added to the lower or back surface in the embodiments of FIGS. 1–4, to reduce surface recombination of carriers. In an alternative arrangement of FIGS. 6–9, a single n+ region of a reduced width may be formed in the lower substrate surface of each unit cell.

The connections indicated schematically in the embodiments of FIGS. 6–10 may be formed by known selective etching and metalization techniques to form the desired metalization (e.g. aluminum) interconnects between the various elements of the solar cell. In other respects, the several embodiments of the invention herein described may be fabricated by known diffusion, anisotropic etching, thermal oxidation, vacuum deposition, chemical vapor deposition, photolithographic and other techniques, which are accordingly not otherwise disclosed herein.

It will be appreciated that the solar cell according to the present invention as exemplified by the several embodiments thereof which are described above in FIGS. 1–9, is particularly suited for use with a light focusing system which directs light onto the active areas; since in FIG. 10, the effective active area is almost the entire exposable area, focusing specifically to a small active area is of lesser importance. The solar cells in general are characterized by a p−n junction which is accurately positioned with respect to the focused incident light to provide optimum carrier generation efficiency on a plurality of individual series-connected solar cells which may be conveniently formed on a common wafer of semiconductor material, such as silicon. And since the solar cell of the invention has no region having a high electrical resistance, the cell is particularly advantageous for use with high-intensity radiation. A plurality of groups of series-connected unit solar cells may be formed on a common wafer but electrically isolated from one another such as by etching grooves completely through the substrate; such etching to divide into separate groups will be understood to be orthogonal to the direction of the etched grooves (as for example filled at 26 in FIG. 1) which separate the individual unit cells of each group, and the outputs of individual groups may be connected externally in parallel.

The solar cell of the invention, particularly in the embodiments of FIGS. 1–4, is characterized in tnat no current flows along or within the plane of the diffused region; the point is particularly significant in case of highly concentrated incident radiation. In the later-described embodiments, there is a limited amount of current flow in the diffused region, which, however, may be made sufficiently thick (or deep), without incurring any undesirable effects, thereby to reduce the resistivity of the diffused region as compared to the relatively shallow diffusion regions that are required in conventional solar cells. And, as noted, in these embodiments, the distances that the carriers travel in the diffused regions are relatively small, thus further reducing the resistance due to current flow in these regions.

It has been noted that the structures of FIGS. 9 and 10 may be essentially the same, the principal difference being the particular surface used to receive incident radiation, electrical interconnections of cells being established at the surface not thus exposed. It will be understood that analogous reversal of surface exposure to radiation (with accompanying reversal of unexposed surface used for electrical interconnection of unit cells) may apply for the basic configurations of other embodiments, as for example the embodiments of FIGS. 6 through 8. Reversability of exposure can also be accomplished for the embodiments of FIGS. 1 to 4, without changing electrical interconnections, because the electrical connections are inherent in the structures of these embodiments.

It will also be appreciated that whereas the solar cell of the invention has been specifically described hereinabove with respect to several embodiments, modifications may be made therein by those skilled in the art without necessarily departing from the spirit and scope of the invention.

What is claimed is:

1. A semiconductor solar cell device comprising plural, spaced, elongate, parallel semiconductor units formed from a common substrate and comprised of a first conductivity type, the body material of each of said units having the same spaced relation to the body material of other of said units as in the original substrate from which they are formed, each unit having spaced elongate upstanding sidewalls and having therebetween an elongate surface adapted for exposure to receive incident radiation, each unit further comprising separate and independent regions of second, opposite conductivity type in the respective side walls of each unit, whereby in each unit said sidewall regions of second conductivity type are separated by body material of said first conductivity type, separate conductive connections establishing ohmic contact between the second-conductivity-type regions of one unit and the first-conductivity-type region of another unit, and means fixedly retaining the material of said parallel units in the same spacial relation as in the common substrate from which they were formed.

2. The semiconductor solar cell of claim 1, in which said fixedly retaining means includes a solid filler in the spaces between said units.

3. The semiconductor solar cell of claim 2, in which said filler is of insulating material.

4. The semiconductor solar cell of claim 3, in which said insulating material is a glass-filled epoxy.

5. The semiconductor solar cell of claim 2, in which a layer of conductive material contacts the second-conductivity-type regions of each of said walls, and in which said filler is of insulating material.

6. The semiconductor solar cell of claim 1, in which at the region local to ohmic contact with said first-conductivity type region each said unit has a higher impurity concentration than at the exposure area of said elongate surface.

7. The semiconductor solar cell of claim 6, in which the region of higher impurity concentration is in the surface opposite the exposure surface of each unit.

8. The semiconductor solar cell of claim 1, in which said sidewalls are parallel.

9. The semiconductor solar cell of claim 1, in which said sidewalls are divergent in the direction of said surface.

10. The semiconductor solar cell of claim 1, in which said sidewalls are convergent in the direction of said surface.

11. A semiconductor solar cell device adapted to receive in essentially a single plane a plurality of spaced, parallel, continuously elongate concentration of incident solar energy and to develop therefrom an electric-power output, comprising an array of plural, spaced, parallel semiconductor units formed from a single, essentially flat substrate and comprised of a first conductivity type and having a surface over which said concentrations may be focused at correspondingly spaced, continuously elongate local regions adapted to be exposed, the body material of each of said units having the same spaced relation to the body material of other of said units as in the original substrate from which they are formed, continuously elongate, spaced, parallel second-type surface regions of a second, opposite conductivity type in the spaces between said exposure-adapted regions and including a second-conductivity-type region in at least one side-wall of each unit, each said unit having a third-type surface region separate and distinct from said exposure-adaptable region and second-type region, said third-type region being of said first conductivity type and having a higher impurity concentration than that at said exposure regions, said third region being on the face of said unit opposite to the exposure-adapted face, and electric-circuit connection means including first conductive means having ohmic contact with said second-type regions and second conductive means having ohmic contact with said third-type regions.

12. A semiconductor solar cell device adapted to receive in essentially a single plane a plurality of spaced, parallel concentration of incident solar energy and to develop an electric-power output therefrom, comprising an array of plural, spaced, parallel semiconductor units formed from a single essentially flat substrate and comprised of a first conductivity type and including opposed side-wall surfaces at spacings such that each unit is exposable to a different one of such concentrations, the body material of each of said units having the same spaced relation to the body material of other of said units as in the original substrate from which they are formed, each unit comprising a region of a second, opposite conductivity type arranged in said unit, said region being local in one of the side-wall surfaces of said unit, and connection means including a conductive element having ohmic contact with said second-conductivity-type region of one unit and ohmic contact with a first-conductivity-type region of an adjacent unit, said second-conductivity-type region being one of two for each unit, the other one of the two being local to the opposed sidewall surface of said one unit, said conductivity element having ohmic contact with both second-conductivity-type regions of said one unit.

13. The semiconductor solar cell of claim 12, in which the ohmic contact with a first-conductivity-type region comprises a third region of said first conductivity type but at a greater impurity concentration than that of said unit.

14. The semiconductor solar cell of claim 13, in which said third region is in the unit surface opposite to the radiation-exposed surface.

15. The semiconductor solar cell of claim 14, in which said sidewall surfaces diverge in the direction of the radiation-exposed surface.

16. The semiconductor solar cell of claim 14, in which said sidewall surfaces converge in the direction of the radiation-exposed surface.

17. The semiconductor solar cell of claim 14, in which said sidewall surfaces are substantially parallel.

18. The semiconductor solar cell of claim 12, in which each space between sidewalls of adjacent units is solid-filled with electrically-insulating material.

19. The semiconductor solar cell of claim 12, in which each space between sidewalls of adjacent units contains an upstanding barrier of substrate material with sidewalls facing the respective space-associated sidewalls of the adjacent units defining the space, each of said barrier sidewalls including a region of the second conductivity type, whereby said barrier includes a first-conductivity-type region separating the two second-conductivity-type sidewall regions thereof, and conductive material filling the spaced between barrier sidewalls and adjacent-unit sidewalls, whereby the first-conductivity-type region of said barrier effectively electrically isolates the second-conductivity-type region of one sidewall of a first unit from the second-conductivity-type region of the adjacent sidewall of the next-adjacent unit.

20. A semiconductor solar cell device comprising plural, spaced, elongate, parallel semiconductor units formed from a common substrate and comprised of a first conductivity type, the body material of each of said units having the same spaced relation to the body material of other of said units as in the original substrate from which they are formed, each unit having spaced, elongate, upstanding sidewalls and having therebetween elongate front and back surfaces of which the front surface is adapted for exposure to receive incident radiation, substantially the entire volume of said body material between front and back surfaces being of said first conductivity type at least to the sidewall regions of the associated unit, each of the sidewalls at the space between two adjacent units further comprising a localized region of a second, opposite conductivity type, a first separate conductive connection establishing ohmic contact between the second-conductivity-type region of one of said two units and the first-conductivity-type region of another of said two units, and a second separate conductive connection establishing ohmic contact between the second-conductivity-type region of the other of said two units and the first-conductivity-type region of another of said units.

21. The semiconductor solar cell of claim 20, in which at the region local to ohmic contact with said first-conductivity type region each said unit has a higher impurity concentration than at the exposure area of said elongate surface.

22. A semiconductor solar cell device comprising plural, spaced, elongate, parallel semiconductor units formed from a common substrate and comprised of a first conductivity type, the body material of each of said units having the same spaced relation to the body material of other of said units as in the original substrate from which they are formed, each unit having spaced, elongate, upstanding sidewalls and having therebetween an elongate surface adapted for exposure to receive incident radiation, each unit further comprising a region of second, opposite conductivity type in both side walls of each unit, separate conductive connections establishing ohmic contact between the second-conductivity-type regions of one unit and the first-conductivity-type region of another unit, said conductive connections including separate conductive means carried at the surface opposite said exposure surface and bridging the space between adjacent units, and means fixedly retaining the material of said parallel units in the same spacial relation as in the common substrate from which they were formed.

*23. A semiconductor solar cell device comprising plural, spaced, elongate, parallel semiconductor units formed from a common substrate and comprised of a first conductivity type, the body material of each of said units having the same spaced relation to the body material of other of said units as in the original substrate from which they are formed, each unit having spaced elongate upstanding sidewalls and having therebetween an elongate surface adapted for exposure to receive incident radiation, each unit further comprising separate and independent regions of second, opposite conductivity type in the respective side walls of each unit, whereby in each unit said sidewall regions of second conductivity type are separated by body material of said first conductivity type, means interconnecting said units for combining the individual electrical outputs of said units, said means comprising separate conductive connections establishing ohmic contact with the respective sidewall regions of said units, and means fixedly retaining the material of said parallel units in the same spacial relation as in the common substrate from which they were formed.*

*24. The semiconductor solar cell of claim 23, in which at the region local to ohmic contact with said first-conductivity type region each said unit has a higher impurity concentration than at the exposure area of said elongate surface.*

*25. A semiconductor solar cell device adapted to receive in essentially a single plane a plurality of spaced, parallel concentrations of incident solar energy and to develop an electric-power output therefrom, comprising an array of plural, spaced, parallel semiconductor units formed from a single essentially flat substrate and comprised of a first conductivity type and including opposed side-wall surfaces at spacings such that each unit is exposable to a different one of such concentrations, the body material of each of said units having the same spaced relation to the body material of other of said units as in the original substrate from which they are formed, each unit comprising a region of a second, opposite conductivity type arranged in said unit, said region being local in one of the side-wall surfaces of said unit, and connection means including means interconnecting said units for combining the individual electrical outputs of said units, said means comprising separate conductive connections establishing ohmic contact with the respective sidewall regions of said units, said second-conductivity-type region being one of two for each unit, the other one of the two being local to the opposed sidewall surface of said one unit, said connection means including for each said unit a conductive element having ohmic contact with both second-conductivity-type regions thereof.*

*26. A semiconductor solar cell device comprising plural, spaced, elongate, parallel semiconductor units formed from a common substrate and comprised of a first conductivity type, the body material of each of said units having the same spaced relation to the body material of other of said units as in the original substrate from which they are formed, each unit having spaced, elongate, upstanding sidewalls and having therebetween elongate front and back surfaces of which the front surface is adapted for exposure to receive incident radiation, substantially the entire volume of said body material between front and back surfaces being of said first conductivity type at least to the sidewall regions of the associated unit, each of the sidewalls at the space between two adjacent units further comprising a localized region of a second, opposite conductivity type, and means interconnecting said units for combining the indi-*

*vidual electrical outputs of said units, said means comprising separate conductive connections establishing ohmic contact with the respective sidewall regions of said units.*

*27. A semiconductor solar cell device comprising plural, spaced, elongate, parallel semiconductor units formed from a common substrate and comprised of a first conductivity type, the body material of each of said units having the same spaced relation to the body material of other of said units as in the original substrate from which they are formed, each unit having spaced, elongate, upstanding sidewalls and having therebetween an elongate surface adapted for exposure to receive incident radiation, each unit further comprising a region of second, opposite conductivity type in both side walls of each unit, means interconnecting said units for combining the individual electrical outputs of said units, said means comprising separate conductive connections establishing ohmic contact with the respective sidewall regions of said units, said conductive connections including separate conductive means carried at the surface opposite said exposure surface, and means fixedly retaining the material of said parallel units in the same spacial relation as in the common substrate from which they were formed.*

* * * * *